United States Patent
Zhang et al.

(10) Patent No.: US 9,363,036 B1
(45) Date of Patent: Jun. 7, 2016

(54) METHODS AND APPARATUS FOR DEFECT DETECTION AND CORRECTION VIA NONBINARY ITERATIVE DECODING

(75) Inventors: Yifei Zhang, Milpitas, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 844 days.

(21) Appl. No.: 13/292,640

(22) Filed: Nov. 9, 2011

Related U.S. Application Data

(60) Provisional application No. 61/411,886, filed on Nov. 9, 2010.

(51) Int. Cl.
*H03M 13/00* (2006.01)
*H04L 1/00* (2006.01)

(52) U.S. Cl.
CPC .................................. *H04L 1/0009* (2013.01)

(58) Field of Classification Search
CPC ... H04L 1/0009; H04L 1/0057; H04L 1/0041; H04L 1/0071; H03M 13/35
USPC ......................................................... 714/774
See application file for complete search history.

(56) References Cited

U.S. PATENT DOCUMENTS

| | | | |
|---|---|---|---|
| 6,684,173 B2 * | 1/2004 | Kessenich et al. | 702/117 |
| 8,086,914 B2 * | 12/2011 | Kimmel | G06F 11/1666 365/185.01 |
| 8,176,400 B2 * | 5/2012 | Tan et al. | 714/791 |
| 8,290,074 B2 * | 10/2012 | Annavajjala et al. | 375/260 |
| 8,332,714 B1 * | 12/2012 | Yang | H03M 13/2987 714/751 |
| 8,443,255 B2 * | 5/2013 | Jiang et al. | 714/758 |
| 8,677,218 B2 * | 3/2014 | Zeng et al. | 714/774 |
| 2012/0047396 A1 * | 2/2012 | Garani et al. | 714/6.12 |
| 2013/0073922 A1 * | 3/2013 | Varnica et al. | 714/758 |

OTHER PUBLICATIONS

Peng hui Tan, Asymptotically Optimal Nonlinear MMSE Multiuser Detection Based on Multivariate Gaussian Approximation, 2006, IEEE, vol. 54, 1427-1438.*

N. Srinidhi, Low-Complexity Near-ML Decoding of Large Non-Orthogonal STBCs using Reactive Tabu Search, 2009, IEEE, 1993-1997.*

* cited by examiner

*Primary Examiner* — Albert Decady
*Assistant Examiner* — Enam Ahmed

(57) ABSTRACT

In nonbinary iterative decoding, a data recovery scheme corrects for corrupted or defective data by determining reliability metrics for blocks of decoded nonbinary data. Block or windowed detectors generate block reliability metrics for data blocks (rather than individual bits) of decoded data using soft information from the regular decoding mode or from new iterative decoding iterations performed during defect detection mode. A defect detection system triggers corrective decoding of selected data blocks based on the block reliability metrics, by for example, comparing the block reliability metrics to a threshold or by selecting an adjustable number of the least reliable data blocks.

15 Claims, 5 Drawing Sheets

_(1)_

METHODS AND APPARATUS FOR DEFECT DETECTION AND CORRECTION VIA NONBINARY ITERATIVE DECODING

CROSS REFERENCE TO RELATED APPLICATION

This disclosure claims the benefit of U.S. Provisional Patent Application No. 61/411,886, filed Nov. 9, 2010, which is hereby incorporated by reference herein in its entirety.

FIELD OF USE

This disclosure relates to methods and apparatus for detecting and correcting residual defects in decoded data using nonbinary iterative decoding.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

In many applications, data—e.g., on a communication channel or in a read channel of a data storage device—is encoded using an outer code. Examples of such codes include turbo codes, Low-Density Parity Check (LDPC) codes, and convolutional codes. Encoded data from an outer code are transmitted over a data channel. In that data channel, the signal might become corrupted with noise or defects. On the receiver side, the received signal can be decoded using iterative decoding principles. In channels with memory (or feedback), a feature of iterative decoding is that decoding includes multiple stages (or iterations), each of which includes a detection/equalization block and an outer decoder block. For example, the signal from a detector front end, which may be a finite impulse response (FIR) filter, may be processed by a soft detector—such as a Soft Output Viterbi Algorithm (SOYA) or a Bahl-Cocke-Jelinek-Raviv (BCJR) detector—that operates on branch metrics computed from the signal received from the detector front end.

The soft detector provides two outputs—(i) hard decisions for the detected signal and (ii) extrinsic log-likelihood ratios (LLRs), which indicate new reliability information generated by the detector for each of the hard decisions. These LLRs are then passed to the outer decoder for further processing. The outer soft decoder then provides its own hard decisions as well as new extrinsic LLRs. These LLRs from the outer decoder are then passed to the soft detector as a priori LLRs. In the next round of iterative decoding, the soft detector generates new extrinsic LLRs, taking both the a priori LLRs and the signal received from the detector front end as inputs. For the first iteration, the a priori LLR inputs to the soft detector are all set to zero. This iterative decoding between soft detector and the outer decoder is carried out until a maximum number of iterations is reached, or a valid code word is found. Iterations may be stopped at the detector or the decoder output. Similar principles apply to memory-less channels (e.g., holographic data storage channels), with the noted exception that iterative decoding in such channels does not include a channel detector.

There are many well-known methods for dealing with channel noise. However, channel defects—i.e., data corruption of a magnitude much greater than noise—must be dealt with differently. In the presence of a channel defect, the signal at the input of the detector is corrupted and thus hard decisions provided by the detector are not reliable and are often in error. A corrupted signal may also cause error propagation to the bits adjacent to the defect location in detector hard decisions, producing "chunk" errors. These errors can further propagate in iterative decoding through unreliable extrinsic LLRs at the defect location. Thus, iterative decoding of channels with defects generally may fail to detect errors at high signal-to-noise ratios (SNR).

SUMMARY

The present disclosure describes systems and methods for detecting and correcting defects in decoded data, using iterative decoding particularly data that was encoded using nonbinary encoding techniques. During operation a defect detection mode is activated which operates on blocks of the decoded data to detect and correct defects in the blocks.

In particular, according to the systems and methods described herein, when data is transmitted, in addition to being encoded, it may also be precoded. Precoding is typically used to improve system performance. Precoding may also be used to simplify later decoding, especially when blocks of data have one or more defects. When defective precoded data is received and decoded, defective blocks of the data tend to display fixed and somewhat predictable sequences. For example, precoded defect data may include a run of 1's. The systems and methods described herein include techniques for detecting such sequences by summing the soft information like log-likelihood ratios (LLRs) corresponding to a data values that represent such sequences and comparing the sum against a threshold.

Such a technique is especially advantageous when performing nonbinary iterative decoding. The LLRs in nonbinary decoders tend to be vectors having LLR entries corresponding to each possible data value. Each LLR entry is typically the metric of likelihood of the corresponding data value. Once a desired sequence of bits is identified, the corresponding position (e.g., row) in the LLR vector is selected. The techniques described herein may then sum the LLRs for the selected vector position across a set of vectors representing a data block. In certain embodiments, if the sum is less than a threshold, the data block is deemed to be defective. The data block may then be corrected or removed as desired.

More particularly, in certain aspects, the systems and methods described herein include methods of detecting a defect in a data block having a plurality of nonbinary data values. The methods may include selecting a length of the data block of nonbinary data values and receiving, at a defect detector, a plurality log-likelihood vectors associated with the plurality of nonbinary data values, each of the plurality of log-likelihood vectors including a plurality of rows, the rows having log-likelihood ratios (LLR) for possible nonbinary data values. A row in the log-likelihood vector may then be selected. The methods further include determining, at the defect detector, a block reliability metric for the data block based at least in part on the LLRs, and in some implementations, the sum of the LLRs, in the selected row of the plurality of log-likelihood vectors in the data block, and detecting, at the defect detector, a defect in said decoded data block if said block reliability metric is less than a threshold.

In certain aspects, the systems and methods described herein include methods for correcting defects in decoded nonbinary data having a plurality of decoded data blocks. In response to determining that a first decoding phase of said decoded data blocks failed, the methods may include receiving a plurality of bit reliability metrics associated with a plurality of data values in said decoded data blocks in a defect detection mode. The methods may include detecting said plurality of decoded data blocks using a windowed detector to obtain a plurality of block reliability metrics, each of said plurality of decoded data blocks having an associated one of said plurality of block reliability metrics, and selecting a subset of said plurality of decoded data blocks based on said plurality of block reliability metrics. The methods may further include erasing said plurality of bit reliability metrics corresponding to said selected subset of decoded data blocks, and iteratively decoding said subset of decoding data blocks in a second decoding phase to obtain a decoded output.

For each of the foregoing embodiments, the block size for which a block reliability metric is computed may be optimized based, for example, on the nature of the data and expected error sizes. In some embodiments, the detection window may be a sliding window in which each bit is involved in several detecting equations, a fixed window in which each bit is involved in exactly one detecting equation, or any suitable combination between the two. Furthermore, the selection of the block size involves a tradeoff between false positives and missed detections. The detectors may be used together in defect detection mode. For example, the defect detection system may run a second detector if a first detector fails to return a valid codeword in defect detection mode.

In the error correction phase, data blocks that are determined to be defective after detection in defect detection mode are iteratively decoded to correct the defect. In an embodiment, the error recovery system erases LLRs associated with the defective blocks and thereby forces corrective decoding of such blocks.

BRIEF DESCRIPTION OF THE DRAWINGS

The above and other advantages of the present disclosure will be apparent upon consideration of the following detailed description, taken in conjunction with the accompanying drawings, in which like reference characters refer to like parts throughout, and in which.

DETAILED DESCRIPTION

The present disclosure describes several post-processing mechanisms for detecting and correcting defects in decoded data using nonbinary iterative decoding. In embodiments described below, a defect detection mode is initiated which operates on blocks of the decoded data to detect and correct residual defects in the blocks. The mechanisms described herein rely on nonbinary iterative decoding principles, and may be implemented in hardware, firmware, or any suitable combination thereof.

Figure 1:
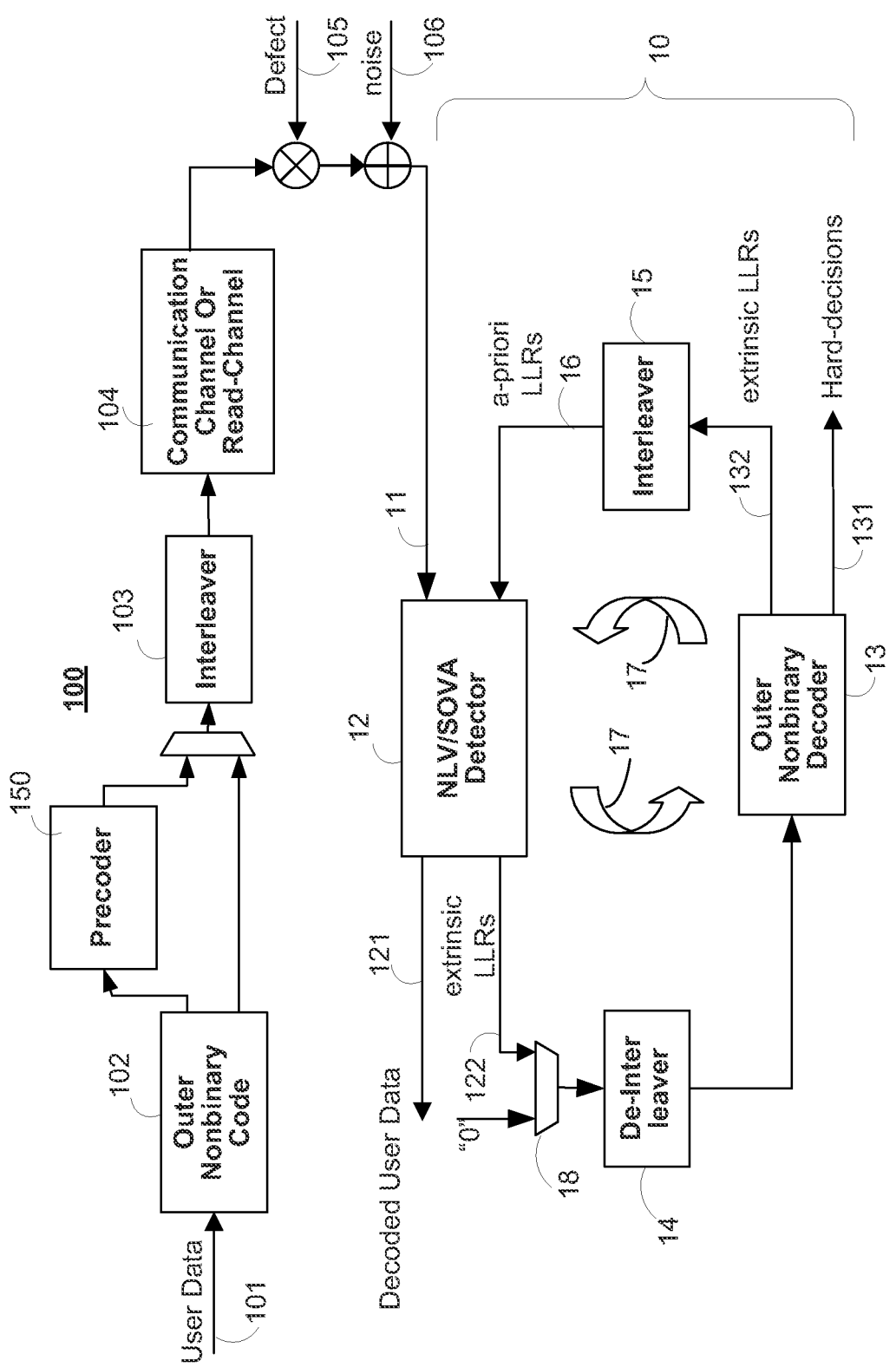
FIG. 1 is a schematic view of a nonbinary iteratively-decoded data channel in accordance with an embodiment of the disclosure.

FIG. 1 illustrates a data channel 100 which includes a nonbinary iterative decoder portion 10. User data are input at 101. The input data are encoded using an outer code nonbinary 102, such as a nonbinary LDPC code or a convolutional code. For simplicity, and without limiting the disclosure as such, it will be assumed that outer code 102 is a nonbinary LDPC code.

Generally, a binary LDPC code, C, is specified in terms of low-density (sparse) N-by-K binary parity check matrix H, where N is the length of a codeword in C and K is a user data size. A binary string c is a codeword in C if and only if H·c=0. Nonbinary LDPC code, W, may also be specified in terms of a low-density (sparse) matrix, H, but the matrix H is nonbinary. A nonbinary string w is a codeword in W if and only if H·w=0. These nonbinary LDPC codes are typically defined in Galois Field (GF) higher than 2. For example, for GF(4), H and W can take four different values: 0, 1, 2 and 3. In certain embodiments, bit and matrix operations for GF(4) LDPC code may be performed in system 100 according to tables 1 and 2 below:

TABLE 1

| Addition | 0 | 1 | 2 | 3 |
|---|---|---|---|---|
| 0 | 0 | 1 | 2 | 3 |
| 1 | 1 | 0 | 3 | 2 |
| 2 | 2 | 3 | 0 | 1 |
| 3 | 3 | 2 | 1 | 0 |
| | | | | |
| Multiplication | 0 | 1 | 2 | 3 |
| 0 | 0 | 0 | 0 | 0 |
| 1 | 0 | 1 | 2 | 3 |
| 2 | 0 | 2 | 3 | 1 |
| 3 | 0 | 3 | 1 | 2 |

Although described with reference to GF(4) nonbinary codes, the present disclosure applies to all sizes of nonbinary LDPC codes. More generally, the present disclosure applies to all types of LDPC codes. This includes both regular and irregular LDPC codes, regardless whether they are structured or random-like.

The encoded data may be further encoded at precoder 150. As will be described later with reference to FIGS. 2 and 3, precoder 150 may be particularly useful to change the error events so as to improve the system performance. In particular, after passing through a transmission channel, defective portions of encoded messages may include a predictable sequence of bits. In certain embodiments, the predictable sequence of bits may include "101010 . . . " In another embodiment, the sequence of bits may include "010101 . . . " Thus, because such sequences associated with defective bits may be predictable and/or fixed, the decoder 12 may be configured with circuitry to detect and/or correct the defective bits. The precoder 150 may be configured with circuitry to simplify detecting defective bits by mapping, on the transmission side, the encoded bits. By mapping the encoded bits according to a suitable precoding function, the predictable sequence of defective bits noted above may be observed as a run of 1's. A run of 1's may be easier and simpler to detect than a plurality of fixed sequences. In certain embodiments, the precoding function may be defined as shown below. Generally, the systems and methods may include any of one or more suitable precoding functions.

$$g(D) = \frac{1}{1+D}$$

In some embodiments, the precoded data may be interleaved at 103, and then communicated or read in channel 104, where defects 105 and noise 106 may be introduced. Nonbinary decoder portion 10 is an illustrative nonbinary iteratively-decoded channel. Equalized data from the detector front end (e.g., a FIR filter; not shown) are input at 11. Decoder portion 10 in this example includes a hard decoder (e.g., Nonlinear Viterbi decoder (NLV)) and a soft decoder 12. In this example, soft decoder 12 includes a SOVA detector, which produces non-return-to-zero (NRZ) output 121, and LLR output 122. However, any suitable soft decoder, such as a BCJR decoder, may be used. Decoder portion 10 also includes an outer nonbinary decoder 13 (e.g., an LDPC decoder, a turbo decoder, or a convolutional decoder).

In general, LLR output 122, which may be a measure of reliability, in binary decoders may be defined as:

$$LLR(b_i) = \log\left(\frac{P(b_i = 0)}{P(b_i = 1)}\right)$$

Where, b represents the bit and an LLR<0 implies a 1 is more likely, and an LLR>0 implies a 0 is more likely.

In certain embodiments, for nonbinary decoder systems, the LLR may be a vector of values. For example, for GF(4) nonbinary codes, the LLR may be a vector having 4 entries and defined as follows:

$$L_u = \begin{bmatrix} 0 \\ \log\left(\frac{p_u(u=0)}{p_u(u=1)}\right) \\ \log\left(\frac{p_u(u=0)}{p_u(u=2)}\right) \\ \log\left(\frac{p_u(u=0)}{p_u(u=3)}\right) \end{bmatrix}$$

In such embodiments, the entries, from top to bottom, may correspond to one of four values, each represented by two bits: 0(00), 1(01), 2(10), 3(11). The minimum entry may correspond to the most likely value. Accordingly, as an example, the LLR output 122 may be a vector having the following values:

$$L = \begin{bmatrix} 0 \\ -1 \\ -4 \\ 5 \end{bmatrix}$$

In such an example, the minimum value is −4 which corresponds to the third entry in the vector, which in turn corresponds to a most likely value of 2 for the nonbinary code.

In certain embodiments, it may be desirable to normalize the LLR vector such that the minimum value (or the LLR value of the most likely entry) is zero. Such an LLR vector may be defined as below:

$$sM_u = \begin{bmatrix} \log\left(\frac{p_u(u=u_{ML})}{p_u(u=0)}\right) \\ \log\left(\frac{p_u(u=u_{ML})}{p_u(u=1)}\right) \\ \log\left(\frac{p_u(u=u_{ML})}{p_u(u=2)}\right) \\ \log\left(\frac{p_u(u=u_{ML})}{p_u(u=3)}\right) \end{bmatrix}$$

Generally, the LLR may be defined in any suitable way for use with encoding and decoding nonbinary codes without departing from the scope of the present disclosure.

During iterative decoding, LLR output 122 of detector 12 may pass through de-interleaver 14 before serving as input to outer decoder 13. Outer decoder 13 provides hard decisions 131 and LLR output 132. LLR output 132 may pass through interleaver 15 which provides de-interleaved LLRs as a priori LLR inputs 16 to detector 12. As indicated by arrows 17, detector 12 and outer decoder 13 are used iteratively—e.g., there may be three iterations—and detector output 121 may be used as the decoded output—i.e., detector 12 may be the last stage in the iterative decoding process. When corrupt or defective data are detected, LLRs at the defective bit locations are set to zero—e.g., using multiplexer 18 to select a "0" instead of the extrinsic LLR from detector 12 so that there is no contribution to the input of the outer decoder from the defective data. In certain embodiments, when corrupt or defective data are detected, information about the defective bit or group of defective bits are stored in one or more defect flags. The outer nonbinary decoder 13 may then use the one or more stored defect flags to perform erasure decoding. In one example when a group of bits are deemed to be defective because a majority of bits are defective, the outer nonbinary decoder 13 may erase all or substantially all the bits in the group and then run normal iterative decoding. Defect detection is described in more detail below with reference to FIG. 2.

In accordance with embodiments of the present disclosure, the decoded data or related soft information may be further processed by an iterative defect detector which detects defects. In typical communication and data storage channels, defects may include long duration defects or short duration defects. In particular, long duration defects may include defects having a length greater than 50 bits. Defects may also include mild or severe defects. The systems and methods described herein may be used to detect long or short and mild or severe defects.

Figure 2:
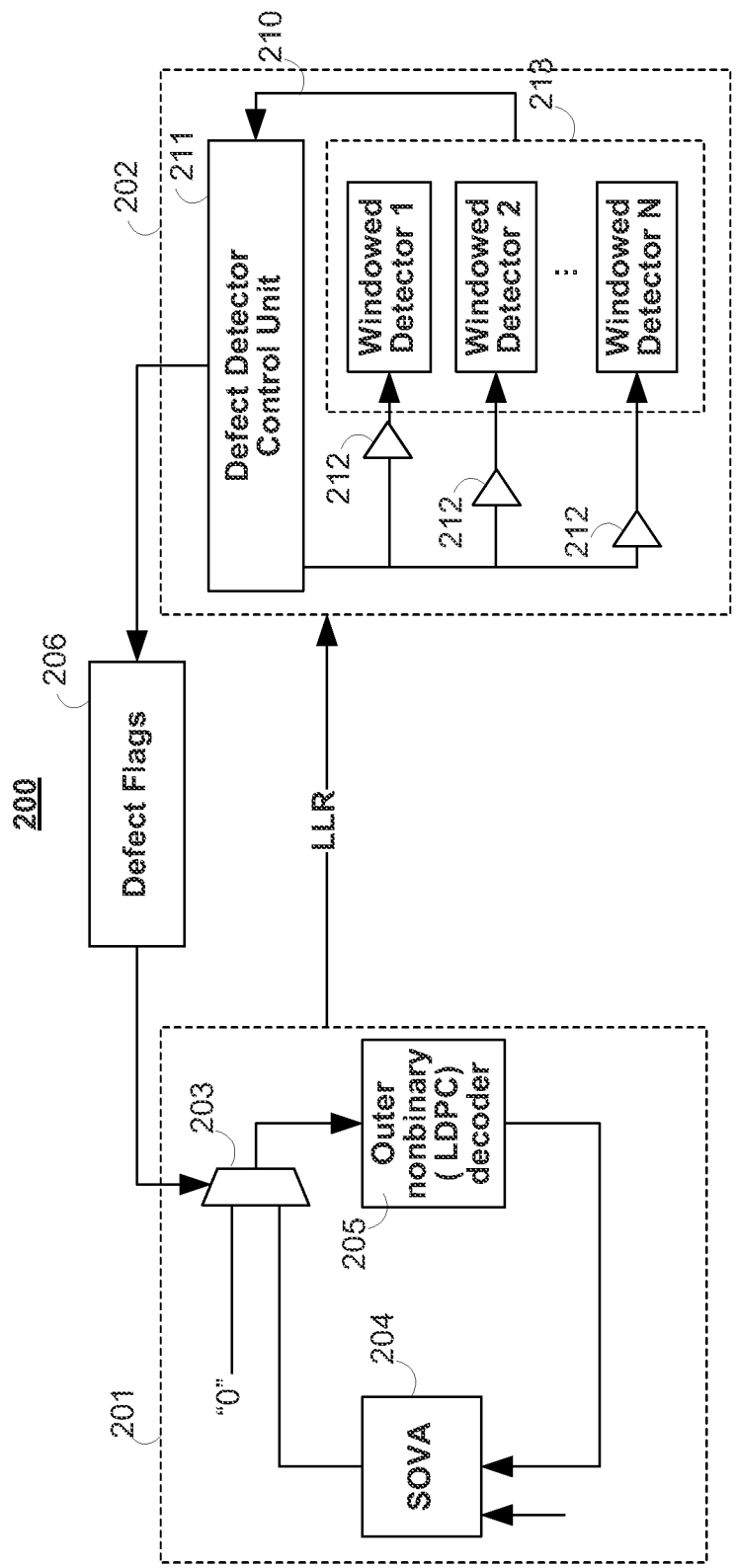
FIG. 2 is a schematic view of a defect detection system 200 according to an embodiment of the disclosure.

FIG. 2 illustrates an iterative defect detector system 200 according to an embodiment of the present disclosure. System 200 includes an iterative decoder portion 201 and an iterative defect detector (IDD) 202. Iterative decoder portion 201 in defect detection mode resembles decoder portion 10 (FIG. 1) and may be the same circuitry as decoder portion 10. In this illustrative embodiment, iterative decoder portion 201 includes SOVA detector 204 and LDPC decoder 205. The number of channel iterations and LDPC iterations in iterative decoder portion 201 may be different from the number of iterations in iterative decoder portion 10. For example, iterative decoder 601 may perform one channel (SOVA) iteration followed by three LDPC iterations when it operates on decoded data in defect detection mode—e.g., the number of SOVA and LDPC iterations may be controlled by iterative defect detector (IDD) 202. In defect detection mode, IDD 202 receives LLR information for a sequence of bits as determined at the decoder 201. As noted above the LLR may include a plurality of vectors when decoding nonbinary code. The IDD 202 utilizes the LLR information to detect whether a window of bits includes defect bits.

Based on decoding information received by IDD 202, defect detector control unit (DDCU) 211 selects, using selectors 212, which one of the one or more "windowed" detectors 213 to apply. An illustrative embodiment of windowed detectors 213 is described below with reference to FIGS. 3A and 3B. As described below, windowed detectors 213 generate block reliability metrics for blocks (rather than individual bits) of decoded data using soft information from the regular decoding mode or from new iterative decoding iterations triggered by IDD 202. In embodiments where windowed detectors 213 rely on soft information from new iterations, IDD 202 may send information about the number of channel (SOYA) and LDPC iterations to be run, as well as decoding statistics to be collected from such iterations, to iterative decoder portion 201. The statistics collected and, in some cases, the number of iterations in defect detection mode, may depend on the type of windowed detector 213. Using the collected decoding statistics, selected windowed detector 213 determines block reliability metrics 210 indicating the reliability of each block of decoded data. Thus, unlike the soft information received from iterative decoder 201, which relates to the reliability of each decoded bit, block reliability metrics 210 returned by windowed detectors 213 are related to the reliability of block of decoded data as a whole. This may produce a more reliable detection result for channels with defects because at high noise amplitudes, residual (undetected) defects typically occur in "chunks" which are difficult to detect in isolated bits.

Based on the output of the selected windowed detector 213, DDCU 211 provides defect flags 206. The defect flag 206 for a block is set if the block is indicated to be defective by selected windowed detector 213. For each block having an active defect flag, the LLRs corresponding to bit locations in the block is erased, and the sector is redetected/re-decoded in the next channel iteration. In the illustrative example of system 200, defect flags 206 control multiplexer 203, which determines the LLR inputs for outer decoder 205 during defect detection. When a defect flag for a bit location is set, multiplexer 203 selects a "0" instead of the SOVA extrinsic LLR for that bit location, thereby causing the detector/decoder to ignore contributions from prior iterations and redetect/re-decode that position in the next iteration.

Figure 3A:
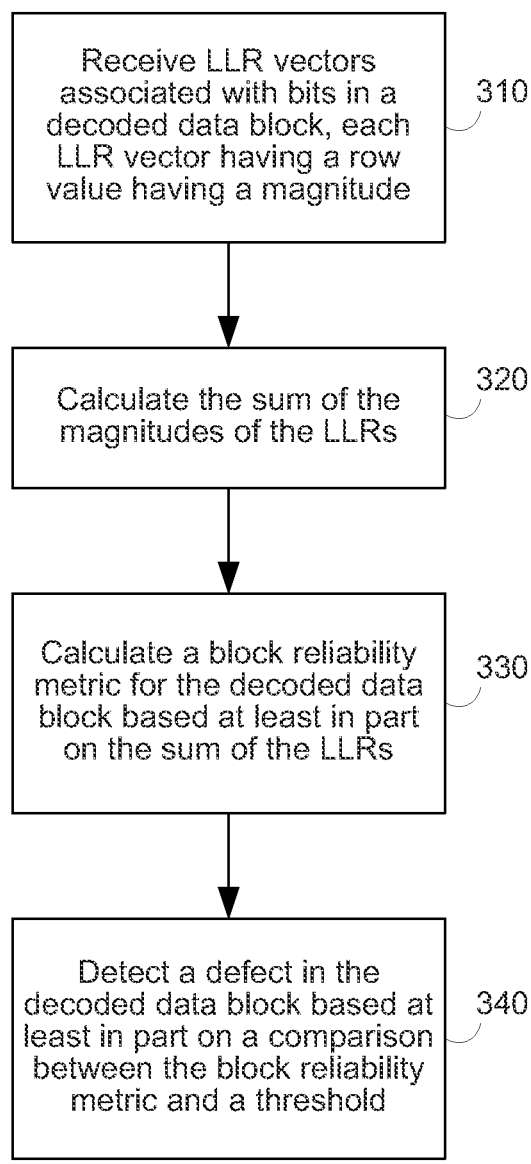
FIG. 3A illustrates process 300 that may be implemented by a block detector in accordance with an embodiment of the disclosure.
Figure 3B:
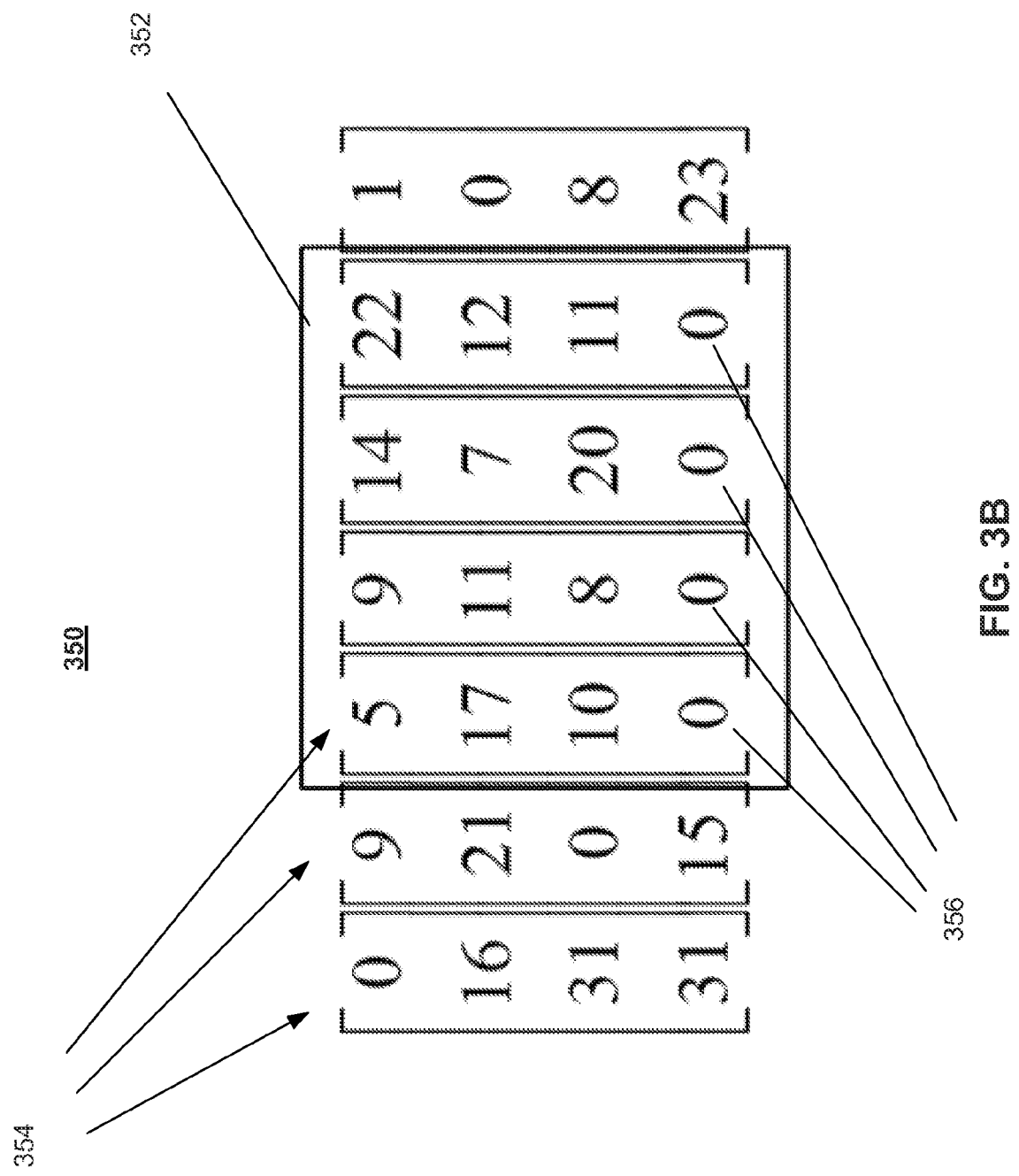
FIG. 3B is an illustrative determination of the LLRs in a defective data block.

FIG. 3A illustrates process 300 that may be employed by a block (or "windowed") detector employed by post-processing unit 202 (FIG. 2) in accordance with an embodiment of the disclosure. Generally speaking, for a GF(4) code, the process 300 detects the presence of a run of 1's in the windowed group of bits. In particular, as noted above, for GF(4) code, the extrinsic LLR is typically a vector representing the LLR values for each of the four values. The minimum value of LLR corresponds to the most likely value of the code. FIG. 3B depicts LLR vectors 354 for a sequence of seven nonbinary GF(4) values. Each vector 354 includes four LLR values, one for each possible nonbinary value (0, 1, 2, and 3). Vectors 354 in window 352 have LLR values of 0 for the nonbinary value of 3. Accordingly, the most likely value for each of the nonbinary values represented in window 352 is three (which is 11 in binary). According the value for bits in the window 352 is 11111111. Since this sequence in window 352 is a run of 1's it may be desirable to assign defect flags to each of these values or a single defect flag to the window 352. Process 300 detects defects in such sequences in an iteratively-decoded data block of size w by comparing the magnitude of the extrinsic LLR per data value within the block to a threshold. Thus, process 500 detects a defect in a data block if:

$$\left(\sum_{j=i}^{i+w} |L_j(3)|\right) < T$$

Where, w is the block or window size; $L_j(3)$ is the extrinsic LLR in row 3 at node j; and T is a reliability threshold determined by the post-processing unit. The equation above is merely illustrative of process 300. In an embodiment that implements the detector of the above equation, at 310, soft information associated with decoded bits in the block is received. In this illustrative embodiment, the soft information includes the extrinsic LLR values generated by a channel (SOVA) iteration for the bits in the block. Referring to FIG. 2, the SOVA iteration may be performed in defect detection mode by iterative decoder portion 201 or it may be selected from the decoding iterations (e.g., the final channel iteration performed by decoder 10) in the regular decoding mode. At 320, a sum $s_w$ of the magnitudes of the extrinsic LLRs of row three is calculated. The process continues at 330 where a block reliability metric for the decoded data block is computed based at least in part on the sum $s_w$. In some embodiments, the sum $s_w$ may be normalized by the block or window size to obtain an average magnitude of extrinsic LLR per bit in the block. However, this normalization is not required. The process continues at 340 where a defect is detected in the data block based on a comparison between the block reliability metric and a threshold T. In some embodiments, the defect is detected if the block reliability metric is less than T. Process 300 may be performed by hardware or firmware. It is understood that process 300 is merely illustrative, and that some steps may be omitted, reversed, or performed simultaneously without departing from the principles of the present disclosure.

Figure 4:
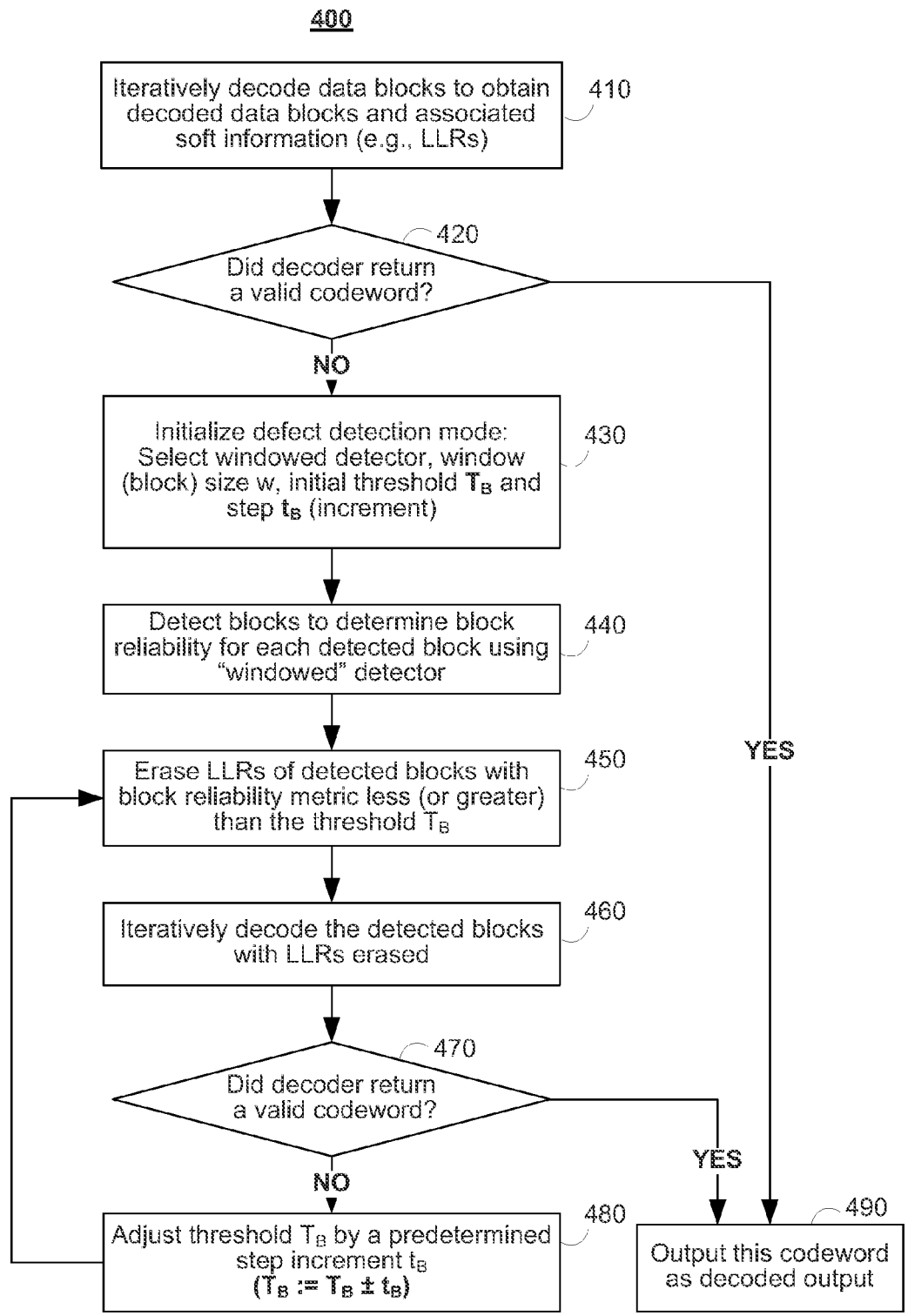
FIG. 4 describes threshold method 400 for detecting and correcting defects in decoded blocks according to an embodiment of the disclosure.

FIG. 4 describes threshold method 400 for detecting and correcting defects in decoded blocks according to an embodiment of the present disclosure. At 410, data received from channel 104 (FIG. 1) are decoded by decoder portion 10 (FIG. 1) to obtain decoded data and associated soft information. At 420, a determination is made whether decoding by decoder portion 10 (FIG. 1) returned a valid codeword. In response to determining that decoding at 410 returned a codeword, the codeword is returned as the decoded output at 490 and defect detection mode is not invoked. Otherwise, defect detection mode is initiated at 430. In an embodiment, IDD 202 (FIG. 2) determines a window or block size w, an initial threshold $T_B$ for selecting defective blocks to be erased, and a step increment $t_B$ that determines an adjustment to $T_B$ during defect correction during error recovery. At 430, defect detector control unit 211 (FIG. 2) of system 200 may select a windowed detector 213 (FIG. 2) to detect defects in data blocks in the decoded data. Selected windowed detector 213 (FIG. 2) may be a detector that implements the process 300 (FIG. 3).

The process continues at 440 where the selected window detector determines a block reliability metric for each block in the decoded data. At 450, data blocks having a reliability metric that fails a constraint on $T_B$ are selected and their associated LLRs are erased, for example, by setting the appropriate defect flags 206 (FIG. 2). For a detector that implements process 300 (FIG. 3), the LLRs for a data block are selected for erasure if the associated block reliability metric is less than $T_B$. The process continues at 460 where blocks having erased LLRs are iteratively decoded. In some embodiments, IDD 202 (FIG. 2) may determine the number of iterations to be performed in this corrective iterative decoding. At 470, a determination is made whether corrective decoding at 460 returned a valid codeword. In response to determining that decoding at 460 returned a codeword, the codeword is returned as the decoded output at 490. Otherwise, the process continues at 480, where the threshold $T_B$ is adjusted by $t_B$. For a detector that implements process 300 (FIG. 3), $T_B$ is increased at 480. The process returns at 450 to erase the additional blocks that fail the constraint on $T_B$. Process 400 may be performed by hardware of firmware. It is understood that process 400 is merely illustrative, and that some steps may be omitted, reversed, or performed simultaneously without departing from the principles of the disclosure.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of detecting a defect in a data block having a plurality of nonbinary data values, comprising:
    receiving, at a defect detector, a plurality of log-likelihood vectors associated with the plurality of nonbinary data values, each of the plurality of log-likelihood vectors including a plurality of rows, the rows having log-likelihood ratios (LLR) for possible nonbinary data values;
    selecting, at the defect detector, a row of the plurality of log-likelihood vectors;
    determining, at the defect detector, a block reliability metric for the data block based at least in part on the LLRs in the selected row of the plurality of log-likelihood vectors in the data block; and
    detecting, at the defect detector, a defect in said decoded data block if said block reliability metric is less than a threshold.

2. The method of claim 1, wherein the nonbinary data values are selected from a group consisting of four values including 0, 1, 2, and 3.

3. The method of claim 2, wherein the nonbinary data values are represented as two-bit values such that the data value of 3 is represented by the bits 11.

4. The method of claim 3, wherein each of the plurality of log-likelihood vectors include four rows, such that the selected row includes the row corresponding to the data value of 3.

5. The method of claim 1, wherein a length of the data block is greater than 5, and the threshold is greater than zero.

6. The method of claim 1, wherein a length of the data block is about half a number of defective bits, and the threshold is from about 1 to about 5.

7. The method of claim 1, further comprising initializing a soft decoder and a hard decoder with a 1/(1+D) precoder.

8. The method of claim 1, further comprising storing, in the defect detector, the defect as a defect flag.

9. The method of claim 8, further comprising sending the defect flag to a soft decoder.

10. A method for correcting defects in decoded nonbinary data having a plurality of decoded data blocks, comprising:
    in a defect detection mode and in response to determining that a first decoding phase of said decoded data blocks failed, receiving a plurality of bit reliability metrics associated with a plurality of data values in said decoded data blocks;
    detecting said plurality of decoded data blocks using a windowed detector to obtain a plurality of block reliability metrics, each of said plurality of decoded data blocks having an associated one of said plurality of block reliability metrics;
    selecting a subset of said plurality of decoded data blocks based on said plurality of block reliability metrics;
    erasing said plurality of bit reliability metrics corresponding to said selected subset of decoded data blocks; and
    iteratively decoding said subset of decoding data blocks in a second decoding phase to obtain a decoded output.

11. The method of claim 10, wherein the selecting comprises:
    comparing each one of said plurality of block reliability metrics to a threshold; and
    selecting a decoded data block for inclusion in said subset if said associated block reliability metric for said decoded data block is less than said threshold.

12. The method of claim 10, wherein the selecting comprises:
    comparing each one of said plurality of block reliability metrics to a threshold; and
    selecting a decoded data block for inclusion in said subset if said associated block reliability metric for said decoded data block is greater than said threshold.

13. The method of claim 10, further comprising:
    determining whether said decoded output is a codeword of an encoding algorithm; and
    in response to determining that said decoded output is not a codeword of said encoding algorithm, incrementing a size of said subset of decoded data blocks and repeating said selecting, erasing, and iterative decoding.

14. The method of claim 13, wherein incrementing the size of said subset comprises adjusting, by a predetermined step increment, a threshold based on which said subset of decoded data blocks is selected.

15. The method of claim 10, wherein said detecting comprises, for each decoded data block in said plurality of decoded data blocks:
    receiving a plurality of log-likelihood vectors associated with a plurality of data values in each said decoded data block, each said vector having a plurality of log-likelihood ratios (LLRs);
    determining a block reliability metric for each said decoded data block based at least in part on a sum of magnitudes of the plurality of LLRs; and
    detecting a defect in said each decoded data block if said block reliability metric is less than a threshold.

* * * * *